(12) United States Patent
Wand

(10) Patent No.: US 9,977,083 B2
(45) Date of Patent: May 22, 2018

(54) SWITCHED HIGH-VOLTAGE SAMPLING CIRCUIT FOR ELECTRIC VEHICLES

(71) Applicant: FORD GLOBAL TECHNOLOGIES, LLC, Dearborn, MI (US)

(72) Inventor: Thomas J. Wand, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 267 days.

(21) Appl. No.: 15/156,788

(22) Filed: May 17, 2016

(65) Prior Publication Data

US 2017/0336476 A1 Nov. 23, 2017

(51) Int. Cl.
| G01R 19/00 | (2006.01) |
| G01R 31/34 | (2006.01) |
| G01R 15/14 | (2006.01) |
| G01R 17/02 | (2006.01) |
| G01R 31/00 | (2006.01) |

(52) U.S. Cl.
CPC .............. *G01R 31/34* (2013.01); *G01R 15/14* (2013.01); *G01R 17/02* (2013.01); *G01R 31/006* (2013.01)

(58) Field of Classification Search
CPC ...... G01R 15/04; G01R 15/14; G01R 15/142; G01R 15/144; G01R 15/22; G01R 17/02; G01R 19/0084; G01R 19/155; G01R 19/16519; G01R 19/16542; G01R 31/006; G01R 31/025; G01R 31/34; G01R 31/36; G01R 31/3606; G01R 31/362; G01R 31/3658

USPC ....... 320/48, 104, 132, 134, 136; 324/76.11, 324/427, 429, 433, 434, 435; 361/18; 702/63

See application file for complete search history.

(56) References Cited

U.S. PATENT DOCUMENTS

| 5,646,534 | A | 7/1997 | Kopera |
| 5,712,568 | A | 1/1998 | Flohr et al. |
| 7,982,427 | B2 | 7/2011 | Magana et al. |
| 8,848,408 | B2 * | 9/2014 | Shindo .................. B60L 3/0007 180/279 |
| 8,970,062 | B2 | 3/2015 | Kunimitsu et al. |
| 9,018,865 | B2 * | 4/2015 | Meyer, III ............ H01M 10/44 318/139 |
| 2004/0212371 | A1 * | 10/2004 | Nomoto ................ B60L 3/0023 324/522 |

(Continued)

FOREIGN PATENT DOCUMENTS

KR 100911565 8/2009

*Primary Examiner* — Arleen M Vazquez
*Assistant Examiner* — Steven Yeninas
(74) *Attorney, Agent, or Firm* — David B. Kelley; MacMillan, Sobanski & Todd, LLC

(57) ABSTRACT

A sampling circuit monitors a high voltage level in an electric vehicle drive. A resistor ladder receives a drive voltage to be sampled and provides sufficient isolation to allow use of low cost switching devices. An N-channel MOSFET is connected between the ladder and a reference resistance. A junction between the source terminal of the MOSFET and the reference resistance provides a sampled voltage output adapted to be input to an analog-to-digital converter. A discrete optocoupler has an output side with a collector and an emitter. The collector is coupled to the resistor ladder, and the emitter is connected to a gate terminal of the MOSFET and coupled to the ground reference by a load resistor.

20 Claims, 4 Drawing Sheets

(56) References Cited

U.S. PATENT DOCUMENTS

2014/0103939 A1* 4/2014 Chatroux .............. G01R 27/18
    324/551
2017/0153295 A1* 6/2017 Huang ................... G01R 31/40

* cited by examiner

SWITCHED HIGH-VOLTAGE SAMPLING CIRCUIT FOR ELECTRIC VEHICLES

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to monitoring high voltages in electric vehicle drives, and, more specifically, to monitoring of battery contactor switches by a microcontroller that is digitally isolated from the high voltages without reliance on expensive switching/isolating devices.

The DC power source (e.g., a battery) and other elements of electric drives for hybrid or electric vehicles require monitoring in order to maximize efficiency and performance as well as to detect potential malfunctions. Common battery types such as lithium ion (Li-Ion) use a large number of cells stacked together into a battery pack generating hundreds of volts. It is very challenging to reliably monitor various conditions of the battery and electric drive system because of the high-voltage levels involved, the range of intermediate voltages at which respective cells operate within the stack, and the high levels of accuracy required.

Monitored voltages of the battery cells, battery pack, and associated devices are used by a main microcontroller or microprocessor for performing battery management and communication. Some of the primary components to be monitored include the battery contactor switches that couple the battery pack to the vehicle loads (e.g., the inverter for driving an electric motor). The main micro is typically located in a discrete battery control module or box that interfaces with other vehicle components such as a vehicle system/powertrain controller or a driver interface module. Consequently, the main micro uses a chassis ground for its voltage reference. The chassis ground is isolated from the main battery's reference which is provided at a negative battery bus.

Monitoring circuits deployed with the battery pack or elsewhere in the high-voltage system (e.g., the main contactors) are referenced to the negative bus. Since they are connected in the high-voltage domain, they must communicate with the main micro through domain-crossing elements that provide digital isolation between the high-voltage battery domain and the chassis ground domain (i.e., low voltage domain) of the main micro.

Monitoring functions such as verifying the state of a main contactor are usually not done on a continuous basis. Instead, a monitoring circuit is selectably switched on when the main micro needs to check on the contactor state. Intermittent checking reduces power consumption and reduces circuit interactions. Due to the high voltage environment, however, the semiconductor devices used for switching and isolation have been relatively expensive. For example, photoMOS switches and opto-isolators with relatively high voltage ratings and high prices have been required. It would be very desirable to avoid the use of such expensive components while maintaining robust detection of the state of the contactor switches, for example.

SUMMARY OF THE INVENTION

In one aspect of the invention, a sampling circuit is used to monitor a high voltage level in an electric vehicle drive. The circuit includes a resistor ladder comprising a plurality of series resistors, wherein a first end of the resistor ladder is connected to receive the drive voltage to be sampled. A reverse blocking diode is connected in series with the ladder and is arranged to conduct a sampling current in response to the drive voltage. An N-channel MOSFET has its drain terminal connected to the series combination of the ladder and the diode. A reference resistance is coupled between a source terminal of the MOSFET and a ground reference of the drive voltage. A junction between the source terminal of the MOSFET and the reference resistance provides a sampled voltage output adapted to be input to an analog-to-digital converter. A discrete optocoupler has an output side with a collector and an emitter. The collector is coupled to the resistor ladder, and the emitter is connected to a gate terminal of the MOSFET and coupled to the ground reference by a load resistor.

DETAILED DESCRIPTION OF PREFERRED EMBODIMENTS

Figure 1:
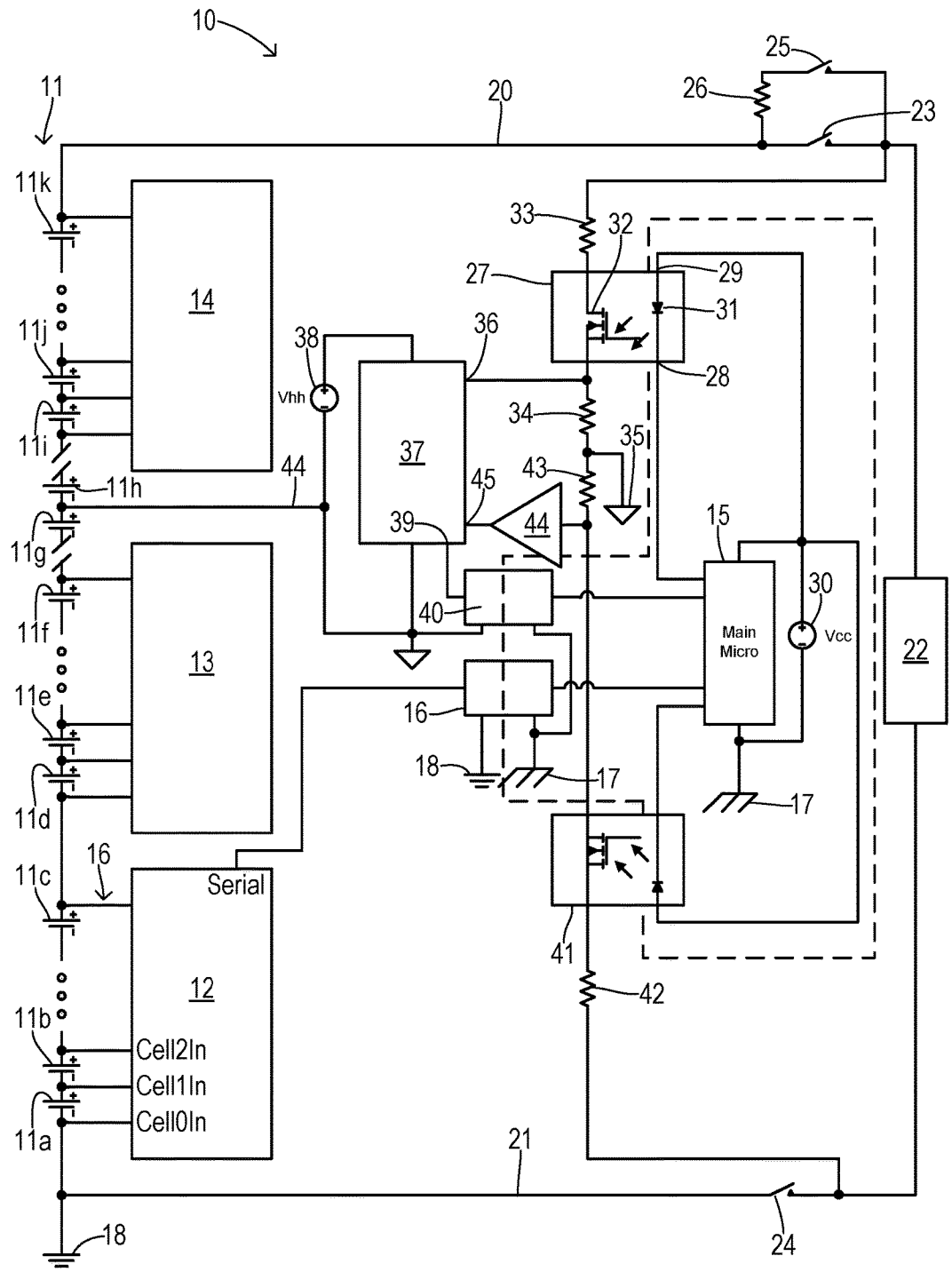
FIG. 1 is a schematic, block diagram showing one embodiment of a prior art electric drive system.

Referring now to FIG. 1, an electric vehicle drive system 10 includes a main battery pack 11 having individual cells including a plurality of representative cells 11a-11k. A plurality of battery monitoring ICs 12, 13, and 14 are connected to respective ones of the battery cells in a stacked manner. Cell monitoring inputs 16 connect each corresponding cell to a respective input pin (e.g., Cell0In) of battery monitoring ICs 12-14. The same interconnections shown for battery monitoring IC 12 would also be present for battery monitoring ICs 13 and 14, but are not all shown in FIG. 1. A main microprocessor 15 receives measured data from a serial output of IC 12 coupled through a digital isolator 16, thereby forming a serial data link capable of two-way communication between the high-voltage domain of IC 12 and the low voltage, chassis grounded domain of main micro 15. Main micro 15 is coupled to a chassis ground 17 while isolation circuit 16 is coupled to both the chassis ground 17 and a high-voltage ground 18.

The output of battery pack 11 is coupled between a positive bus 20 and a negative bus 21. Vehicle loads 22 such as a DC-to-AC inverter for driving an electric motor machine (which may be preceded by a DC-to-DC boost converter) receives DC power from busses 20 and 21 via main contactor switches 23 and 24, respectively. A precharge switch 25 and precharge resistor 26 may be coupled across one of the contactors (e.g., positive contactor switch 23) as known in the art. Contactor switches are driven in a conventional manner as known in the art.

Main micro 15 monitors the state of contactor switches 23 and 24 to ensure they properly respond to their respective control signals (not shown). Thus, it is desired to measure the voltages at the load sides of switches 23 and 24, which requires measurement in the high-voltage domain. The state of contactor switches 23 and 24 has typically been inferred based on measured voltages at the junctions between the contactor switches and the load. For example, a first domain-crossing device 27 is comprised of a photoMOS device with a control input 28 coupled to receive a logic-level control signal from main micro 15. A reference input 29 receives a reference voltage vcc from a supply 30. Main micro 15 pulls down input 28 to a low logic level in order to activate a photodiode light source 31 in photoMOS device 27 thereby turning on an output transistor 32.

A resistor 33 couples a drain of transistor 32 to the load side of contactor switch 23. A source of transistor 32 is connected to one side of a resistor 34 having its other side coupled to a midpoint voltage reference 35 at a midpoint of battery pack 11. In other known embodiments, a midpoint reference is not used. The source of transistor 32 is further connected to a conversion input 36 of a dedicated analog-to-digital converter (ADC) 37. A high-voltage-domain auxiliary source 38 provides a supply voltage $v_{hh}$ for ADC 37. When main micro 15 initiates an evaluation of the state of contactor switch 23, it activates domain crossing device 27, thereby turning on transistor 32 and forming a voltage divider comprised of resistors 33 and 34 between the load side of contact switch 23 and reference voltage 35. The voltage at the junction of resistors 33 and 34 is sampled by ADC 37 and the resulting digital value is output by a serial output 39 to an isolation circuit 40 for transmission back to a corresponding serial input of main micro 15.

In order to determine the state of negative contactor switch 24, a domain crossing photoMOS device 41 similarly connected to main micro 15 activates a voltage divider comprised of resistors 42 and 43 between midpoint reference voltage 35 and the load side of switch 24. A voltage appearing between resistors 42 and 43 is inverted by an inverting amplifier 44 and coupled to a converting input 45 on ADC 37, and the resulting digital value is coupled from output 39 back to main micro 15. In each case, main micro 15 evaluates the digital values obtained from the voltage dividers to determine whether battery voltage is seen or not seen as expected according to the commanded state of contactor switches 23 and 24.

Figure 2:
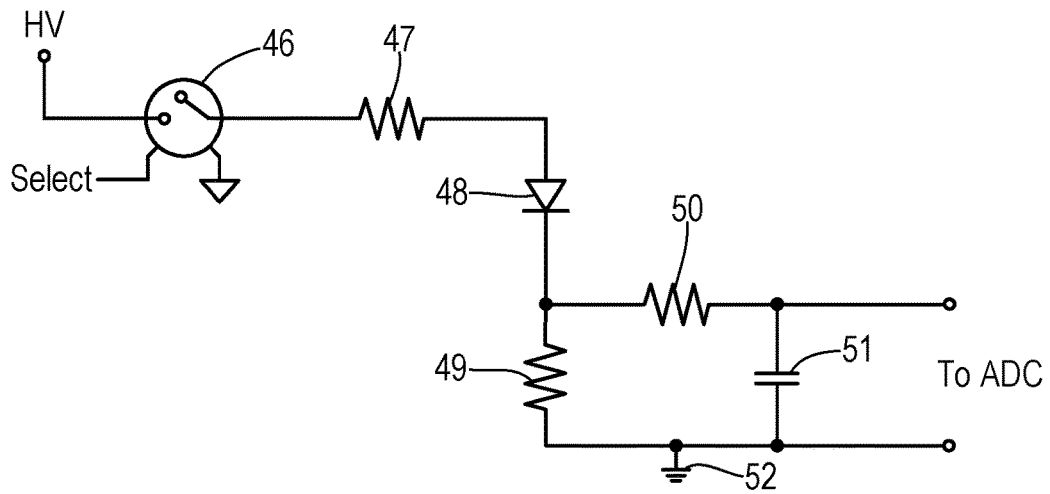
FIG. 2 is a schematic diagram showing another embodiment of a prior art high voltage sampling circuit.

FIG. 2 shows another prior art sampling circuit that can be used to sample a high voltage associated with a main contactor relay or for other high voltage nodes in an electric vehicle such as an inverter, generator, pump, or battery charger. A photoMOS device 46 has an input side connected to receive a SELECT signal from a controller in a low voltage domain. An output side of photoMOS device 46 is connected between a high voltage (HV) to be measured and a resistor 47. Resistor 47 is connected to a high-voltage ground 52 via a reverse blocking diode 48 and a reference resistor 49. Resistors 47 and 49 form a voltage divider. When device 46 is turned on by the SELECT signal, a current through the voltage divider generates a voltage drop across resistor 49 proportional to the ratio of the resistance of resistor 49 to the sum of the resistances of resistor 47 and resistor 49. The voltage drop is lowpass filtered by a filter comprised of a resistor 50 and a capacitor 51. An output voltage of the filter across capacitor 51 is coupled to an analog-to-digital converter (not shown) and the digital result can be provided to a digital controller in a conventional manner.

In the circuits of FIGS. 1 and 2, the use of expensive photoMOS devices is necessitated by the galvanic proximity of the switches to the high voltage of the power bus and by the fact that the output side of the isolating device is in series with the voltage divider and carries the full current flow of the voltage divider. As shown in the following embodiments, the present invention overcomes the limitations of the prior art by using lower cost parts in a circuit which also achieves improved reliability. More specifically, an N-channel MOSFET is placed at a relatively low voltage close to the high voltage ground and driven by an optocoupler. The optocoupler drives the gate of the N-channel MOSFET but does not carry the current of the voltage divider.

N-channel MOSFETs are produced in high volumes and are supplied by many different manufacturers, resulting in a low cost per device. Moreover, the circuit topology allows use of an optocoupler for providing the necessary isolation, and the need for an opto-isolator is avoided. An optocoupler is a smaller type of device intended to provide isolation for less than about 5,000 volts. It is a discrete device with a small package size, usually as a dual in-line package (DIP) or surface mount device (SMD). This is in contrast to more expensive opto-isolators which provide isolation voltages from 5,000 to over 50,000 volts and which require larger package sizes.

Figure 3:
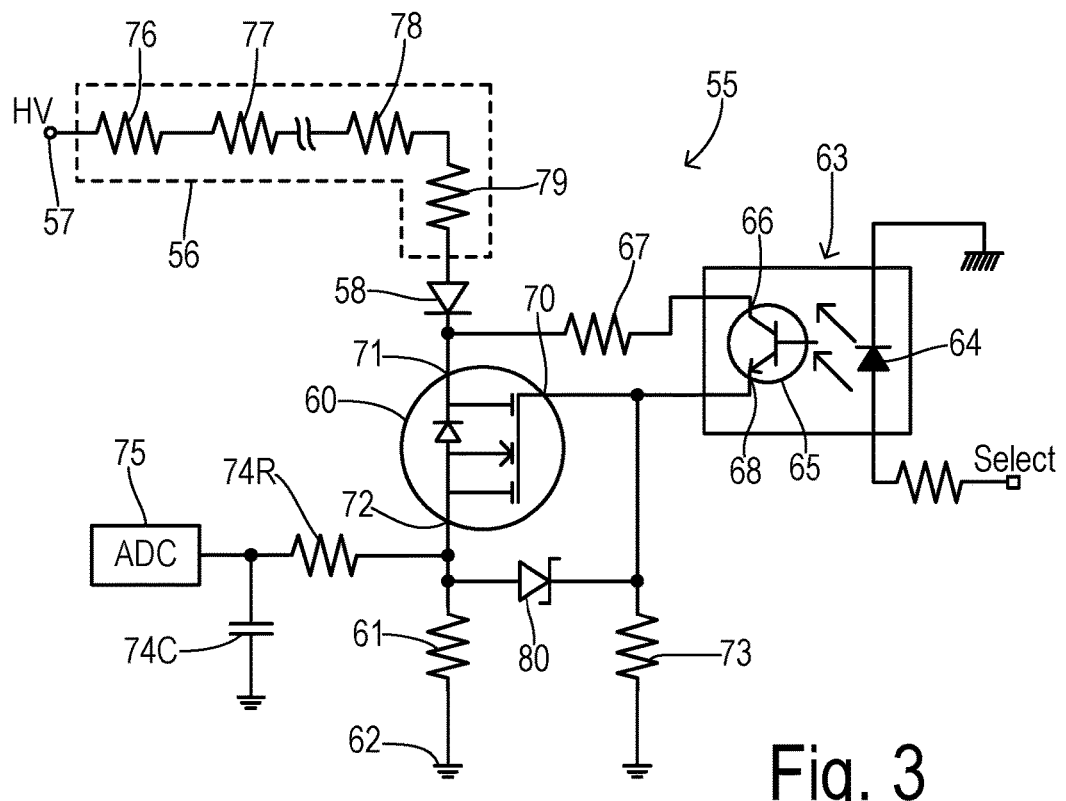
FIG. 3 is a schematic diagram of one preferred embodiment of the invention using lower cost devices such as an N-channel MOSFET instead of a photoMOS device.

FIG. 3 shows a sampling circuit 55 of the present invention having a resistor ladder 56 connected at one end to a high-voltage HV at a terminal 57. This illustrated embodiment is adapted to monitor a positive contactor, and one skilled in the art can easily adapt the circuit for monitoring a negative contactor (e.g., with polarity of some components being reversed). The other end of resistor ladder 56 is connected to an anode of a reverse blocking diode 58 with its cathode connected to an enhancement mode N-channel MOSFET 60. An output of MOSFET 60 is connected in series with diode 58 and a reference resistance 61 further connected to a high-voltage ground 62. An input of MOSFET 60 is controlled by a discrete optocoupler 63. And input side of optocoupler 63 comprises a light emitting diode 64 for receiving a select signal from a main microcontroller. When the select signal is active, light is transferred from LED 64 to a phototransistor 65 at the output side of optocoupler 63 having a collector 66 and an emitter terminal 68. Collector 66 is connected to a pull-up resistor 67 which is further connected to reverse blocking diode 58 to provide a supply voltage to phototransistor 65. Emitter 68 is connected to an input of MOSFET 60 at a gate terminal 70 and to a load resistor 73. When phototransistor 65 is activated, it supplies a gate current to a gate terminal 70 of MOSFET 60 to establish a conduction channel and provide a current flow through MOSFET 60 from a drain terminal 71 to a source terminal 72. The junction between source terminal 72 and reference resistance 61 provides a sampled voltage output to an analog-to-digital converter 75 via a lowpass filter comprised of a resistor 74R and a capacitor 74C. The sampled voltage output is approximately equal to a ratio of reference resistance 61 to the total resistance for the path from HV terminal 57 to reference ground 62 via resistive resistor ladder 56 and reference resistance 61. A zener diode 80 is connected between source terminal 72 and gate terminal 70 to protect against overvoltage damage as known in the art.

Resistor ladder 56 is comprised of a plurality of series resistors which are configured to provide a voltage drop that achieves a desired isolation prior to the connections of MOSFET 60 and optocoupler 63. Resistor ladder 56 is shown with four resistors 76-79, although a greater or fewer number of resistors may be employed depending on the magnitude of the high voltage. The number of resistors to be used depends, in part, on the individual voltage ratings of each of the resistors. A typical voltage rating for commonly available resistor devices may be about 150 volts. Thus, the numbers of resistors and their respective proportion of the total resistance are chosen to keep each respective voltage drop (when there is a maximum value of voltage HV) within the specified voltage ratings of each individual device. Furthermore, layout of the resistor ladder on a printed circuit board is designed to maintain necessary creepage distance requirements as known in the art. As a result, resistor ladder 56 easily provides a desired voltage isolation to thereby enable safe and reliable use of a commonly available, relatively low cost components for the N-channel MOSFET and the optocoupler (it being noted that the N-channel MOSFET is still a high voltage device in terms of having a breakdown voltage sufficient to handle the maximum battery voltage).

Figure 4:
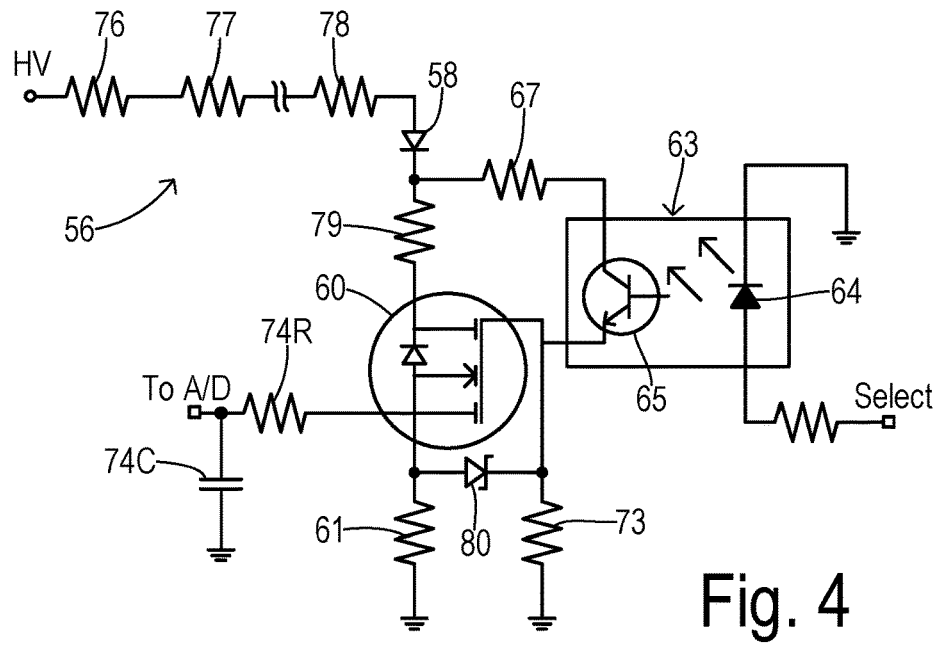
FIG. 4 is a schematic diagram of another preferred embodiment of the invention which incorporates a gate boost for a sampling switch.

The circuit in FIG. 3 employs MOSFET 60 in a "follower" configuration. Consequently, there would be a voltage drop across MOSFET 60 corresponding to the gate voltage ($V_{gs}$) across it even when MOSFET 60 is in the ON state. Another voltage drop across phototransistor 65 adds to the ON state voltage drop across MOSFET 60. The combined effects result in a small offset in the sampled voltage appearing at the junction between drain terminal 71 of MOSFET 60 and reference resistor 61. The small offset can be reduced or eliminated with a modification to the voltage sampling circuit of the invention as shown in FIG. 4. This modified circuit provides a gate boost wherein the gate drive to MOSFET 60 is increased by an amount adapted to counteract the voltage offset.

FIG. 4 shows all the same components as in FIG. 3, with the modification that a connection point for pull-up resistor 67 of optocoupler 63 has been relocated to a position upstream in resistor ladder 56. Thus, pull-up resistor 67 taps into resistor ladder 56 between series resistors 78 and 79. Consequently, the emitter of phototransistor 65 is at a higher voltage, and a corresponding gate drive applied to MOSFET 60 is higher. A higher gate drive voltage reduces the voltage drop across MOSFET 60. In order to maintain the reverse blocking function of diode 58 for optocoupler 63, reverse blocking diode 58 is also moved upstream into resistor ladder 56 at a position upstream of pull-up resistor 67.

Figure 5:
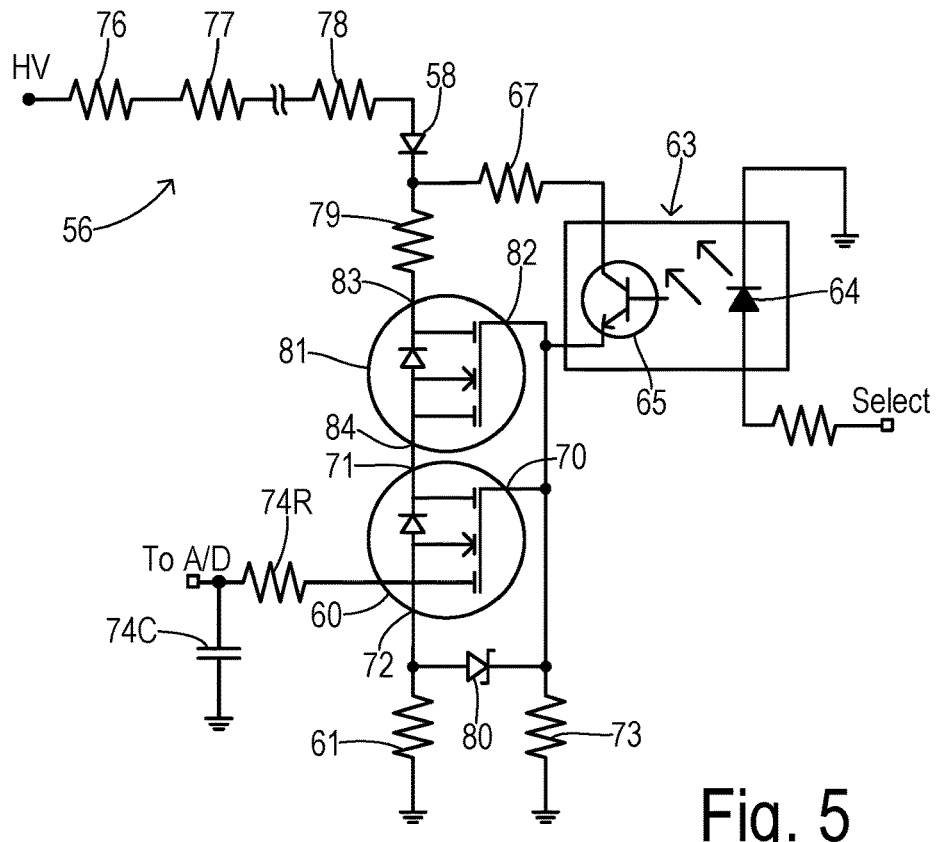
FIG. 5 is a schematic diagram of another preferred embodiment for increasing isolation and reducing switching time (i.e., increasing the switching speed) with a second N-channel MOSFET.

In another embodiment for providing even further isolation, a second enhancement mode N-channel MOSFET 81 may be added in series as shown in FIG. 5. Alternatively, it may be desirable to stack two or more MOSFETs in order to use devices having a lower voltage rating. A source terminal 84 of MOSFET 81 is connected to drain terminal 71 of MOSFET 60 and a drain terminal 83 of MOSFET 81 is connected to resistor ladder 56 at resistor 79. A gate terminal 82 of MOSFET 81 is connected to the emitter of phototransistor 65 in common with gate terminal 70 of MOSFET 60. In addition to increased isolation or separation voltage capability, the addition of a second MOSFET in series with the first provides additional circuit reliability and increases the switching speed.

Figure 6:
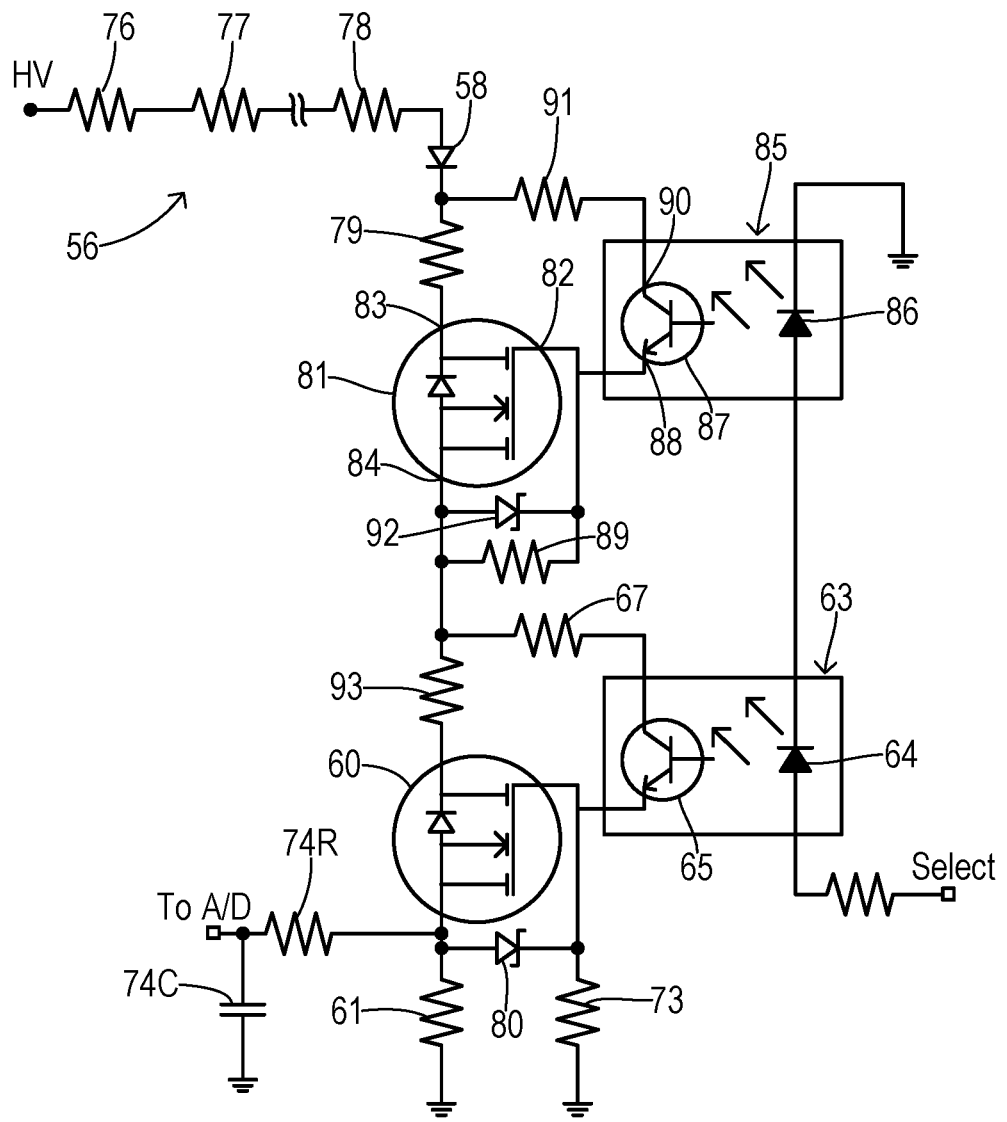
FIG. 6 is a schematic diagram of another preferred embodiment with separate optocouplers for each controlling a separate N-channel MOSFET.

With the use of a second MOSFET, the voltage level seen at the drain terminals of the MOSFETs may be further increased. Therefore, it may become desirable to provide additional isolation (and/or to provide faster transitions) by providing a separate optocoupler for each MOSFET as shown in FIG. 6. An optocoupler 85 having an LED 86 at its input side and a phototransistor 87 at its output side is provided for controlling N-channel MOSFET 81. An emitter 88 of phototransistor 87 is connected to gate terminal 82 of MOSFET 81 and to source terminal 84 via a load resistor 89. A zener diode 92 protects against overvoltage damage to MOSFET 81. A collector 90 of phototransistor 87 is coupled to an intermediate junction within resistor ladder 56 via a pull-up resistor 91. Thus, when a SELECT signal is applied to LEDs 64 and 86, phototransistor 87 is turned on and then it supplies a gate drive to gate terminal 82. MOSFETs 60 and 81 are simultaneously turned on and the high-voltage is reliably divided-down and provided to a sampling output across capacitor 74C. In order to maintain the gate boost desired for MOSFET 60, an additional resistor 93 is placed in series between MOSFETs 60 and 81 to correspondingly increase the gate drive for MOSFET 60.

What is claimed is:

1. A sampling circuit for an electric vehicle drive voltage, comprising:
   a resistor ladder comprising a plurality of series resistors, wherein a first end of the resistor ladder is connected to receive the drive voltage to be sampled;
   a reverse blocking diode in series with the ladder and arranged to conduct a sampling current in response to the drive voltage;
   an N-channel MOSFET having a drain terminal connected to the series combination of the ladder and the diode;
   a reference resistance coupled between a source terminal of the MOSFET and a ground reference of the drive voltage, wherein a junction between the source terminal of the MOSFET and the reference resistance provides a sampled voltage output adapted to be input to an analog-to-digital converter; and
   a discrete optocoupler having an output side with a collector and an emitter, wherein the collector is coupled to the resistor ladder, and wherein the emitter is connected to a gate terminal of the MOSFET and coupled to the ground reference by a load resistor.

2. The circuit of claim 1 wherein the collector of the optocoupler is connected to the resistor ladder at an intermediate junction between adjacent ones of the series resistors to provide a boosted voltage to the gate terminal.

3. The circuit of claim 1 wherein the collector of the optocoupler is connected to a cathode of the reverse blocking diode.

4. The circuit of claim 1 wherein the reverse blocking diode is connected to a second end of the resistor ladder.

5. The circuit of claim 1 wherein the reverse blocking diode is connected at an intermediate junction in the ladder between adjacent ones of the series resistors.

6. The circuit of claim 1 further comprising a second N-channel MOSFET connected in series with the first N-channel MOSFET.

7. The circuit of claim 6 wherein the emitter of the optocoupler is connected to gate terminals of both the first and second N-channel MOSFETs.

8. The circuit of claim 6 further comprising a second optocoupler controlling the second N-channel MOSFET, wherein the second N-channel MOSFET is connected at a first intermediate junction in the ladder between adjacent ones of the series resistors, and wherein the collector of the second optocoupler is connected at a second intermediate junction in the ladder at a higher voltage than the first intermediate junction.

9. The circuit of claim 1 wherein the optocoupler has an input side adapted to be coupled to a microcontroller to receive a sampling command signal, and wherein the microcontroller is adapted to receive the sampled voltage output from the analog-to-digital converter.

10. The circuit of claim 1 further comprising a pull-up resistor coupling the collector of the optocoupler to the resistor ladder.

11. The circuit of claim 1 further comprising a zener diode coupled between the source terminal and the gate terminal of the MOSFET.

12. The circuit of claim 1 wherein the reference resistance provides a resistance value less than about one tenth of an aggregate resistance value of the resistor ladder.

13. A contactor monitor for an electric vehicle drive system, comprising:
 a contactor adapted to selectably connect a DC power source to a power bus for an inverter of the drive system;
 a resistor ladder comprising a plurality of series resistors, wherein a first end of the resistor ladder is connected to the power bus;
 a reverse blocking diode in series with the ladder and arranged to conduct a sampling current in response to the DC power source;
 an N-channel MOSFET having a drain terminal connected to the series combination of the ladder and the diode;
 a reference resistance coupled between a source terminal of the MOSFET and a ground reference of the power bus, wherein a junction between the source terminal of the MOSFET and the reference resistance provides a sampled voltage output adapted to be input to an analog-to-digital converter; and
 a discrete optocoupler having an output side with a collector and an emitter, wherein the collector is coupled to the resistor ladder, and wherein the emitter is connected to a gate terminal of the MOSFET and coupled to the ground reference by a load resistor.

14. The monitor of claim 13 wherein the collector of the optocoupler is connected to the resistor ladder at an intermediate junction between adjacent ones of the series resistors to provide a boosted voltage to the gate terminal.

15. The monitor of claim 13 wherein the collector of the optocoupler is connected to a cathode of the reverse blocking diode.

16. The monitor of claim 13 wherein the reverse blocking diode is connected to a second end of the resistor ladder.

17. The monitor of claim 13 wherein the reverse blocking diode is connected at an intermediate junction in the ladder between adjacent ones of the series resistors.

18. The monitor of claim 13 further comprising a second N-channel MOSFET connected in series with the first N-channel MOSFET.

19. The monitor of claim 18 wherein the emitter of the optocoupler is connected to gate terminals of both the first and second N-channel MOSFETs.

20. A sampling circuit, comprising:
 a resistor ladder adapted to receive a drive voltage to be sampled;
 a MOSFET having output terminals connected between the ladder and a reference resistance coupled to a ground reference of the drive voltage, a junction between the MOSFET and the reference resistance providing a sampling output; and
 a discrete optocoupler having an output side connected between an intermediate junction of the ladder and a gate terminal of the MOSFET.

* * * * *